(12) United States Patent
Shen (10) Patent No.: US 7,459,094 B2
(45) Date of Patent: Dec. 2, 2008

(54) METHOD FOR MAKING A SURFACE ACOUSTIC WAVE DEVICE PACKAGE

(75) Inventor: Chi-Yen Shen, Kaohsiung (TW)

(73) Assignee: I Shou University (TW)

( * ) Notice: Subject to any disclaimer, the term of this patent is extended or adjusted under 35 U.S.C. 154(b) by 94 days.

(21) Appl. No.: 11/675,751

(22) Filed: Feb. 16, 2007

(65) Prior Publication Data

US 2007/0187360 A1      Aug. 16, 2007

Related U.S. Application Data

(62) Division of application No. 10/982,204, filed on Nov. 5, 2004, now Pat. No. 7,198,725.

(51) Int. Cl.
*B44C 1/22* (2006.01)
*C23F 1/00* (2006.01)
*H01L 21/00* (2006.01)

(52) U.S. Cl. .............................. 216/2; 216/41; 216/83; 438/689; 438/745

(58) Field of Classification Search .................... 216/2, 216/41, 83; 438/689, 745
See application file for complete search history.

(56) References Cited

U.S. PATENT DOCUMENTS

| 6,855,637 B2 | 2/2005 | Yamashita et al. |
| 2004/0207491 A1 | 10/2004 | Nakaya et al. |

*Primary Examiner*—Shamim Ahmed
(74) *Attorney, Agent, or Firm*—Ostrolenk, Faber, Gerb & Soffen, LLP (57) ABSTRACT

A method for making a SAW device package includes the steps of: forming a pattern of a metal layer, that defines transmitting and receiving transducers of a SAW die, on a wafer; forming a pattern of a first photo sensitive layer, which defines a peripheral wall of a cap of the SAW die, on the metal layer and the wafer through lithography techniques; forming a pattern of a second photo sensitive layer, which defines a cover wall of the cap of the SAW die, on the first photo sensitive layer through lithography techniques; curing the first and second photo sensitive layers; dicing the wafer into SAW dies; and encapsulating the SAW dies with a molding compound.

4 Claims, 11 Drawing Sheets

METHOD FOR MAKING A SURFACE ACOUSTIC WAVE DEVICE PACKAGE

CROSS-REFERENCE TO RELATED APPLICATION

The present application is a Divisional application Ser. No. 10/982,204 filed Nov. 5, 2004 U.S. Pat. No. 7,198,725, incorporated by reference.

BACKGROUND OF THE INVENTION

1. Field of the Invention

This invention relates to a method for making a surface acoustic wave (SAW) device package, more particularly to a method for making a SAW device package using semiconductor processing techniques.

2. Description of the Related Art

A surface acoustic wave (SAW) device normally includes a piezoelectric substrate with a transducer-mounting surface, and transmitting and receiving transducers formed on the transducer-mounting surface for transmitting and receiving surface waves propagating along the transducer-mounting surface of the substrate. Each of the transmitting and receiving transducers is in the form of a thin metal film, and includes a pair of opposing bus bars with a plurality of fingers extending from the bus bars in an interdigital manner. The SAW device is required to be enclosed within an enclosure so as to form an air cavity to permit propagation of surface acoustic wave within the cavity. Due to the cavity required between the enclosure and the transducer-mounting surface of the substrate, the SAW device cannot be directly molded with a molding compound, which is commonly used for packaging semiconductor chips, such as memory chips, to form the enclosure thereon. As a consequence, conventional ways of forming the enclosure are normally conducted by forming a casing to enclose the SAW device.

Figure 1:
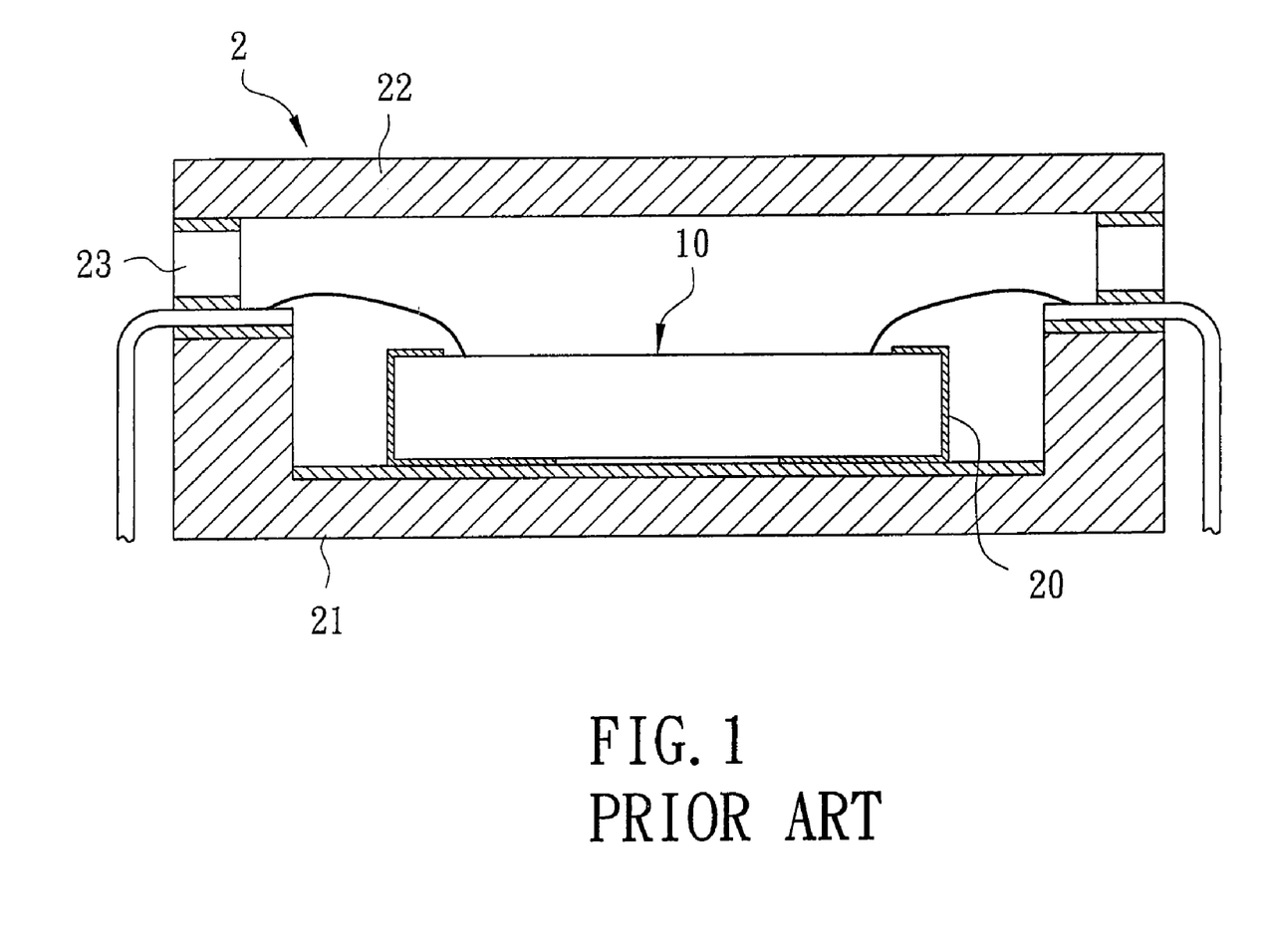
FIG. 1 is a fragmentary sectional view of a conventional SAW device.

FIG. 1 illustrates a conventional SAW device that is disclosed in U.S. Pat. No. 4,845,397 and that includes a SAW die 10, a cradle 20 constraining the SAW die 10, and a casing 2 enclosing sealingly the assembly of the SAW die 10 and the cradle 20.

The casing 2 includes a base 21, a cover 22 disposed over the base 21, and a spacer 23 interposed between and connected sealingly to the base 21 and the cover 22. The manufacturing process of the aforesaid conventional SAW device is complicated and is relatively expensive. Moreover, the size of the aforesaid conventional SAW device is relatively large, and is difficult to be reduced. As a consequence, combining the conventional SAW device with a printed circuit board and electronic components to form a SAW device package, which includes a molding compound encapsulating the SAW device, the electronic components, and a portion of the printed circuit board, is not possible.

SUMMARY OF THE INVENTION

Therefore, the object of this invention is to provide a SAW device package that is capable of overcoming the aforesaid drawbacks of the prior art.

According to one aspect of the present invention, there is provided a method for making a surface acoustic wave (SAW) device package that includes a SAW die having a piezoelectric substrate, and transmitting and receiving transducers and a cap formed on the substrate. The cap has a peripheral wall and a cover wall which cooperate with the substrate to define an embedded air cavity thereamong. The method comprises the steps of: forming a pattern of lift-off layer on a wafer surface of a wafer through lithography techniques; forming a metal layer on the wafer surface of the wafer and the lift-off layer through metallization techniques; removing the lift-off layer and the metal layer on the lift-off layer by dissolving the lift-off layer in a solution so as to form a pattern of the metal layer, that defines the transmitting and receiving transducers of the SAW die, on the wafer surface of the wafer; forming a pattern of a first photo sensitive layer, which defines the peripheral wall of the cap of the SAW die, on the metal layer and the wafer surface of the wafer through lithography techniques; forming a pattern of a second photo sensitive layer, which defines the cover wall of the cap of the SAW die, on the first photo sensitive layer through lithography techniques; curing the first and second photo sensitive layers; dicing the wafer into SAW dies; and encapsulating the SAW dies with a molding compound.

According to another aspect of the present invention, there is provided a method for making the SAW device package. The method comprises the steps of: forming a metal layer on a wafer surface of a wafer through metallization techniques; forming a pattern of a photoresist layer on the metal layer through lithography techniques; etching an exposed portion of the metal layer that is exposed from the photoresist layer so as to form a pattern of the metal layer, which defines the transmitting and receiving transducers of the SAW die, on the wafer surface of the wafer; forming a pattern of a first photo sensitive layer, which defines the peripheral wall of the cap of the SAW die, on the metal layer and the wafer surface of the wafer through lithography techniques; forming a pattern of a second photo sensitive layer, which defines the cover wall of the cap of the SAW die, on the first photo sensitive layer through lithography techniques; curing the first and second photo sensitive layers; dicing the wafer into SAW dies; and encapsulating the SAW dies with a molding compound.

BRIEF DESCRIPTION OF THE DRAWINGS

Other features and advantages of the present invention will become apparent in the following detailed description of the preferred embodiments of the invention, with reference to the accompanying drawings. In the drawings.

DETAILED DESCRIPTION OF THE PREFERRED EMBODIMENTS

Before the present invention is described in greater detail, it should be noted that same reference numerals have been used to denote like elements throughout the specification.

Figure 2:
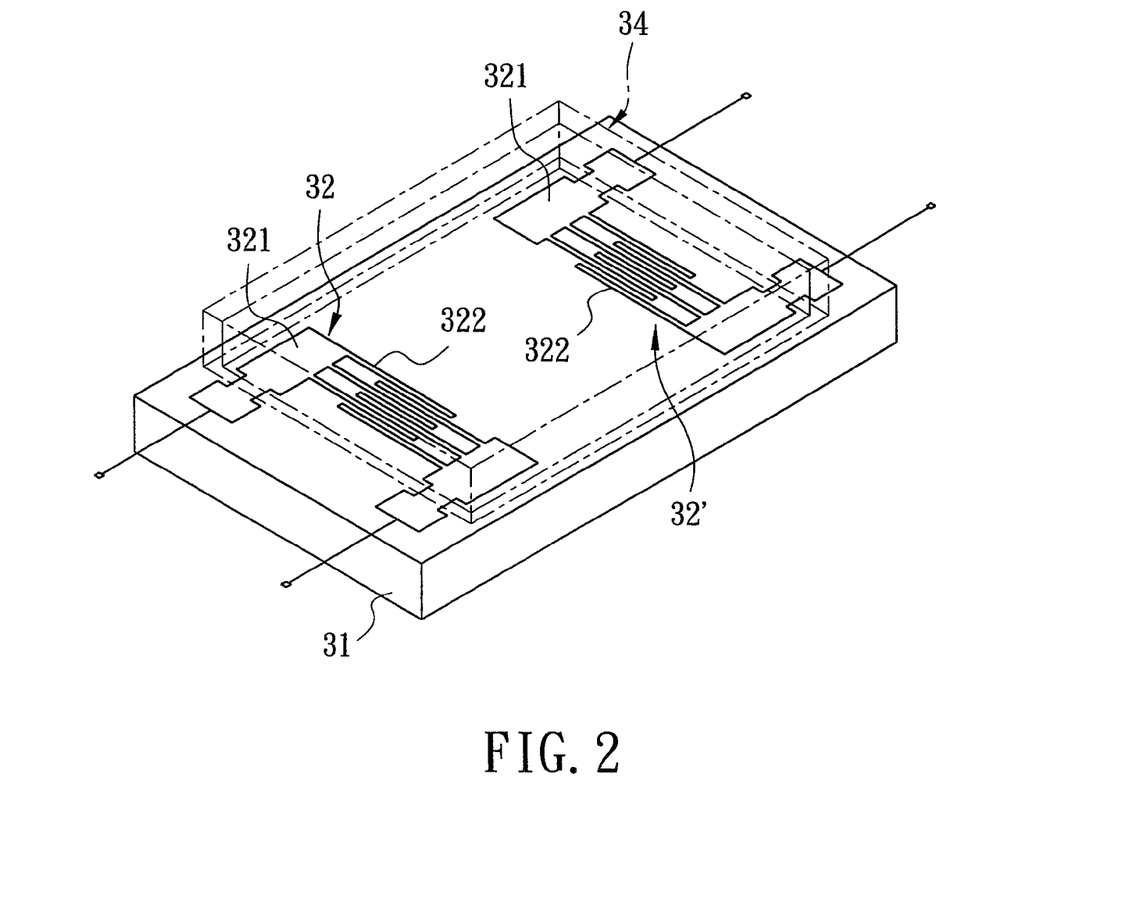
FIG. 2 is a perspective view of the first preferred embodiment of a SAW device package according to this invention.
Figure 3:
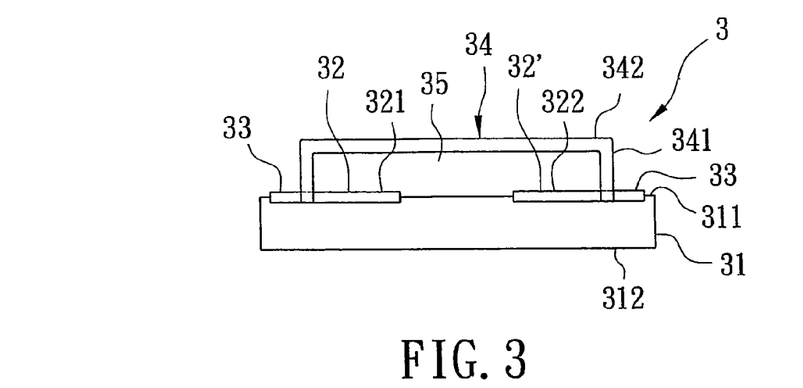
FIG. 3 is a schematic view to illustrate the configuration of a SAW die of the first preferred embodiment with a cap formed thereon.
Figure 4:
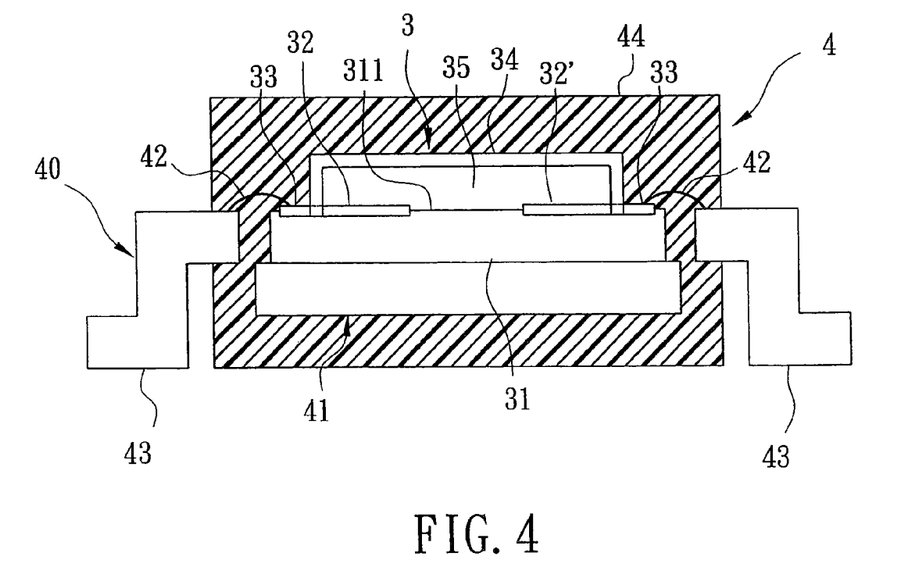
FIG. 4 is a sectional view to illustrate the SAW die of the first preferred embodiment.

FIGS. 2 to 4 illustrate the first preferred embodiment of a surface acoustic wave (SAW) device package 4 according to this invention.

The SAW device package 4 includes: a SAW die 3 including a piezoelectric substrate 31 with a transducer-mounting surface 311, a transmitting transducer 32 formed on the transducer-mounting surface 311 for generating surface acoustic waves that propagate along the transducer-mounting surface 311, a receiving transducer 32' formed on the transducer-mounting surface 311 for receiving the surface acoustic waves that propagate along the transducer-mounting surface 311, a plurality of conductive connecting pads 33 formed on the transducer-mounting surface 311 and connected electrically and respectively to the transmitting and receiving transducers 32, 32', and a cap 34 that has a peripheral wall 341 which is formed on and which extends transversely and outwardly from the transducer-mounting surface 311 and which has a top opening distal from the transducer-mounting surface 311, and a cover wall 342 that is formed on the peripheral wall 341 to cover the top opening in the peripheral wall 341, the cap 34 cooperating with the substrate 31 to define an embedded air cavity 35 therebetween in such a manner that the transmitting and receiving transducers 32, 32' are confined in the embedded air cavity 35 and that at least a portion of each of the connecting pads 33 is disposed outwardly of the embedded air cavity 35; a conductive external-connecting unit 40 that is connected electrically to the connecting pads 33 for electrically connecting the SAW die 3 to an external device (not shown); and a molding compound 44 encapsulating the SAW die 3.

In this embodiment, the cap 34 is formed on the transducer-mounting surface 311 of the substrate 31 by semiconductor processing techniques, and is made from a photo sensitive material selected from the group consisting of photoresists, epoxy resin, polyimide, benzocyclobutene, acrylic-based materials, and mixtures thereof. Preferably, the substrate 31 is made from a piezoelectric material that is selected from the group consisting of quartz, $LiNbO_3$, $LiTaO_3$, $Li_2B_4O_7$, and $La_3Ga_5SiO_{14}$. Alternatively, the substrate 31 can be made from a non-piezoelectric material coated with a piezoelectric film, such as ZnO, $Al_2O_3$, and $PbZrO_3$.

The substrate 31 further has an external-mounting surface 312 that is opposite to the transducer-mounting surface 311. The external-connecting unit 40 includes a conductive lead frame 41 that is attached to the external-mounting surface 312 of the substrate 31 and that includes a plurality of leads 43 respectively having portions disposed outwardly of the molding compound 44. The leads 43 of the lead frame 41 are connected electrically and respectively to the connecting pads 33 through a plurality of bonding wires 42 which are encapsulated by the molding compound 44. Each of the transmitting and receiving transducers 32, 32' is in the form of a thin film, and includes a pair of opposing bus bars 321 with a plurality of fingers 322 extending from the bus bars 321 in an interdigital manner.

Figure 5:
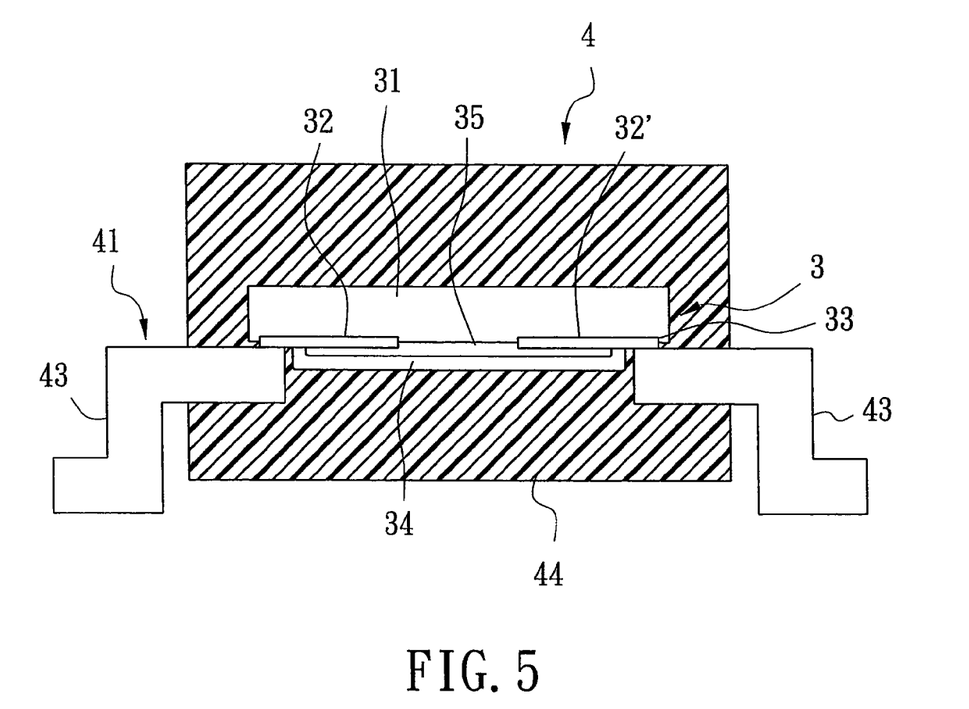
FIG. 5 is a sectional view of the second preferred embodiment according to this invention.

FIG. 5 illustrates the second preferred embodiment of the SAW device package 4 according to this invention. The SAW device package 4 of this embodiment differs from the previous embodiment in that the leads 43 of the lead frame 41 are directly and respectively connected to the connecting pads 33 without using the bonding wires 42.

Figure 6:
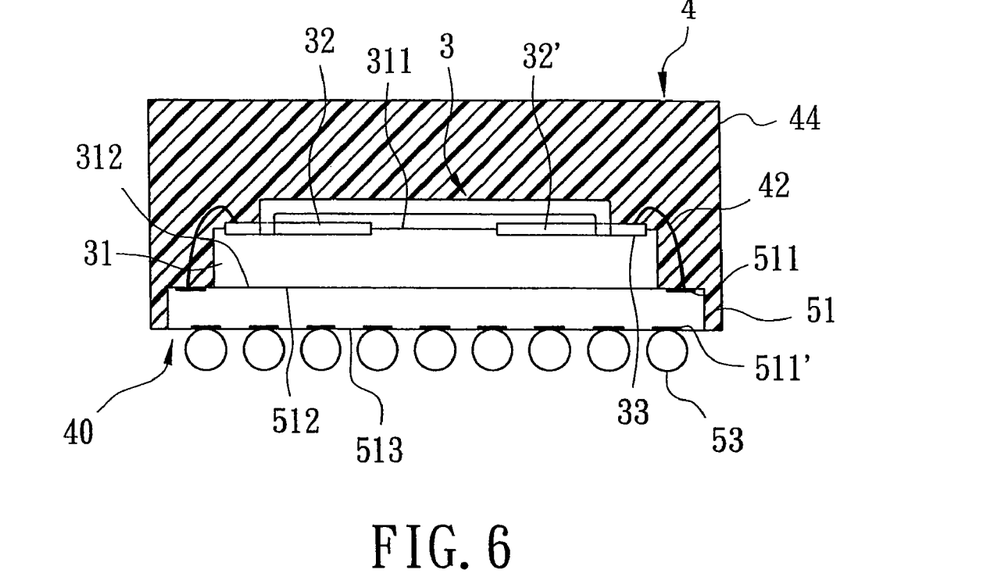
FIG. 6 is a sectional view of the third preferred embodiment according to this invention.

FIG. 6 illustrates the third preferred embodiment of the SAW device package 4 according to this invention. The SAW package 4 of this embodiment differs from the first embodiment in that the external-connecting unit 40 includes a printed circuit board 51 that is inlaid in the molding compound 44, and that has an inner surface 512 which is attached to the external-mounting surface 312 of the substrate 31, an outer surface 513 which is opposite to the inner surface 512, a plurality of conductive inner contacts 511 which are formed on the inner surface 512 and which are connected electrically and respectively to the connecting pads 33 through the bonding wires 42, a plurality of outer contacts 511' which are formed on the outer surface 513 of the printed circuit board 51, and a plurality of conductive outer bumps 53 which are connected electrically to the outer contacts 511', and which protrude outwardly of the molding compound 44. The printed circuit board 51 is covered by the molding compound 44 in such a manner that the outer surface 513 of the printed circuit board 51 is exposed therefrom.

Figure 7:
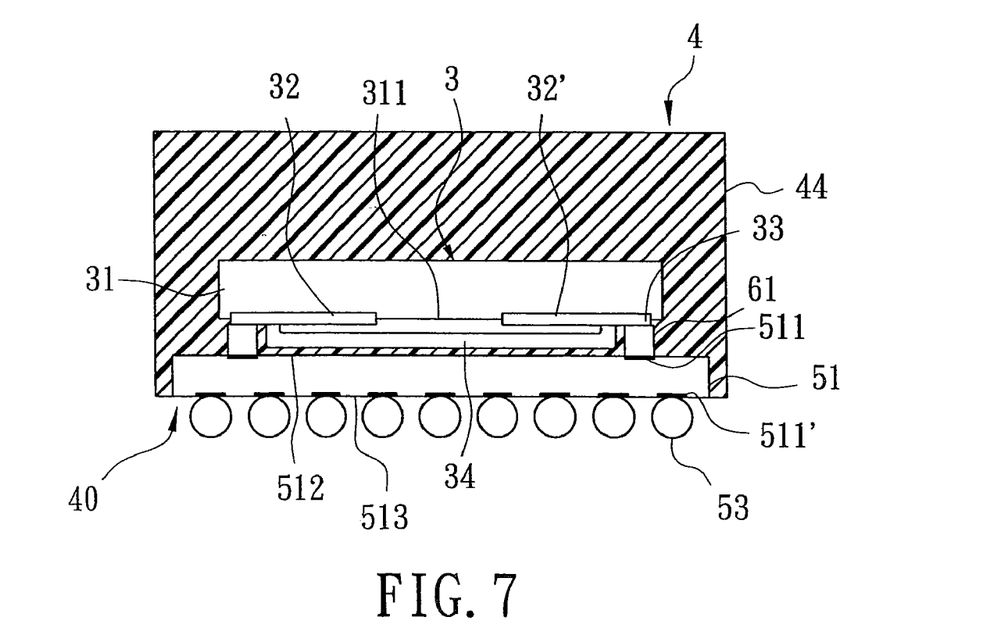
FIG. 7 is a sectional view of the fourth preferred embodiment according to this invention.

FIG. 7 illustrates the fourth preferred embodiment of the SAW device package 4 according to this invention. The SAW device package 4 of this embodiment differs from the second embodiment in that the external-connecting unit 40 includes a printed circuit board 51 that is inlaid in the molding compound 44, and that has an inner surface 512 which confronts the transducer-mounting surface 311 of the substrate 31, an outer surface 513 which is opposite to the inner surface 512, a plurality of conductive contacts 511 which are formed on the inner surface 512 and which are connected electrically and respectively to the connecting pads 33 through a plurality of conductive inner bumps 61, and a plurality of conductive outer bumps 53 which are formed on the outer surface 513, and which protrude outwardly of the molding compound 44.

Figure 8:
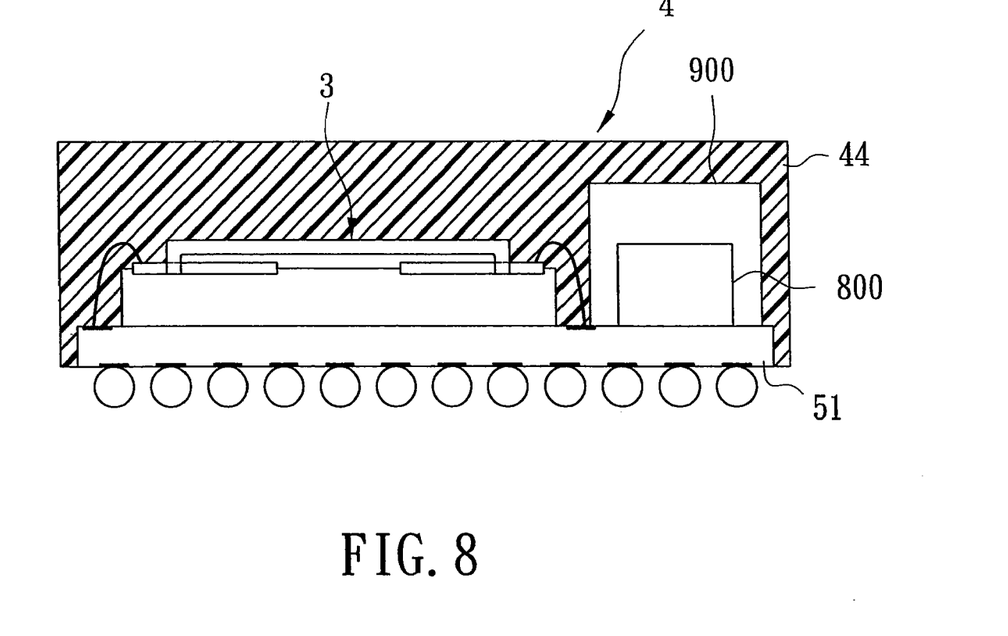
FIG. 8 is a sectional view of the fifth preferred embodiment modified from the third preferred embodiment.

FIG. 8 illustrates the fifth preferred embodiment of the SAW device package 4 according to this invention. The SAW device package 4 of this embodiment is modified from the third embodiment by further including electronic components 800, 900, such as a resistor and a capacitor. The electronic components 800, 900 are mounted on the printed circuit board 51 and are encapsulated by the molding compound 44.

Figure 9:
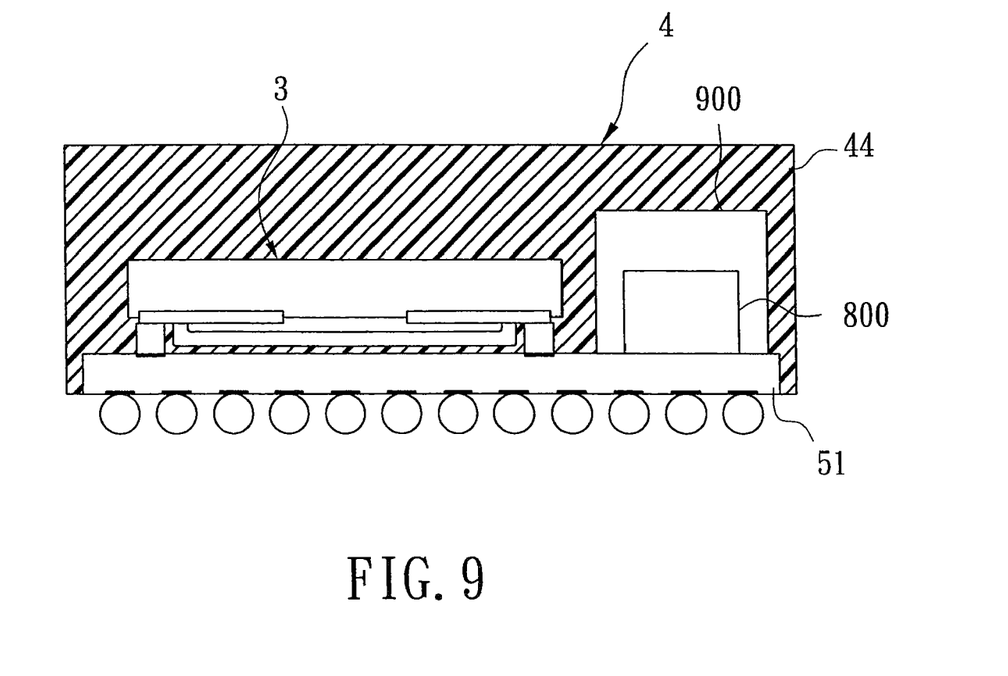
FIG. 9 is a sectional view of the sixth preferred embodiment modified from the fourth preferred embodiment.

FIG. 9 illustrates the sixth preferred embodiment of the SAW device package 4 according to this invention. The SAW device package 4 of this embodiment is modified from the fourth embodiment by further including electronic components 800, 900 that are mounted on the printed circuit board 51 and that are encapsulated by the molding compound 44.

Figure 10:
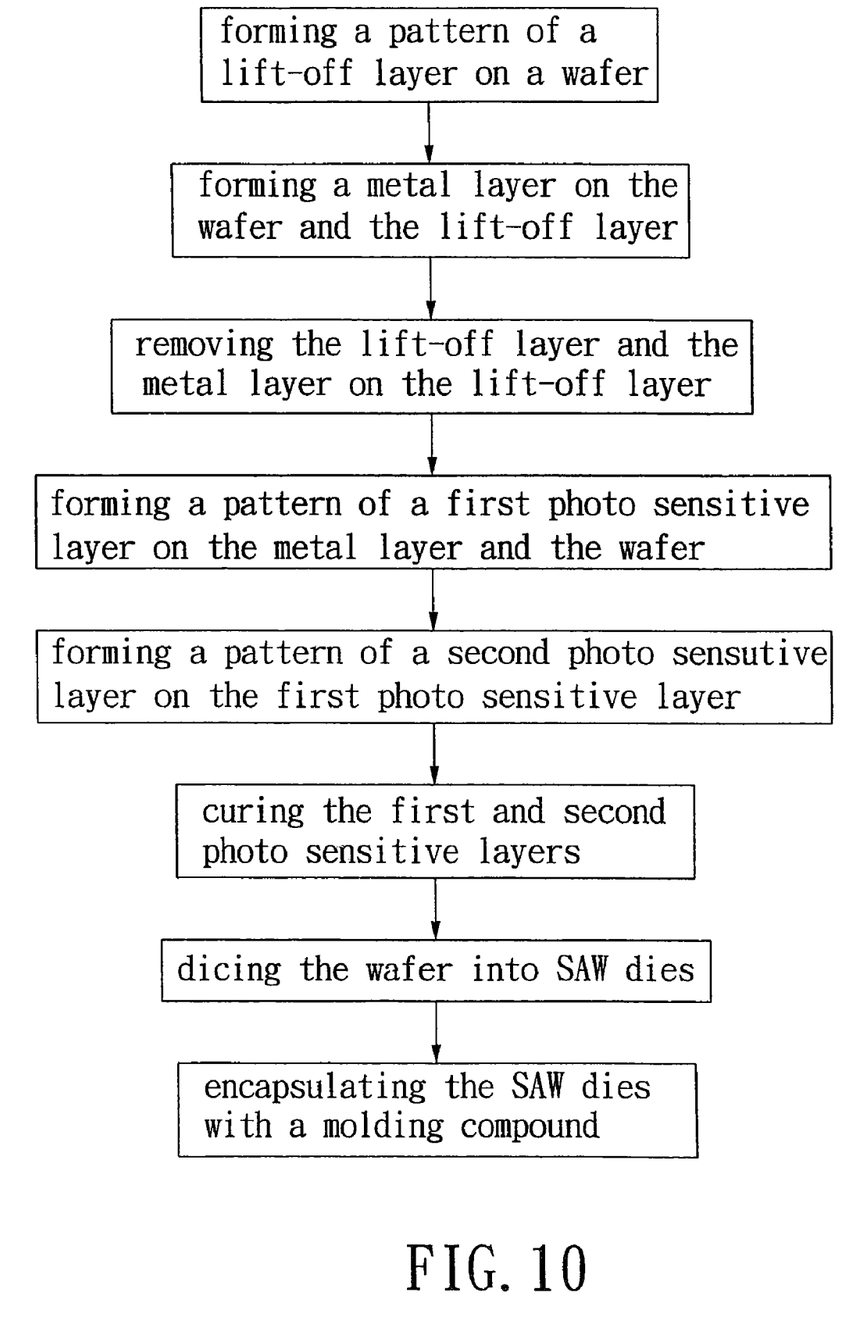
FIG. 10 is a flow diagram illustrating consecutive steps of the first preferred embodiment of a method for forming the SAW die according to this invention.
Figure 11:
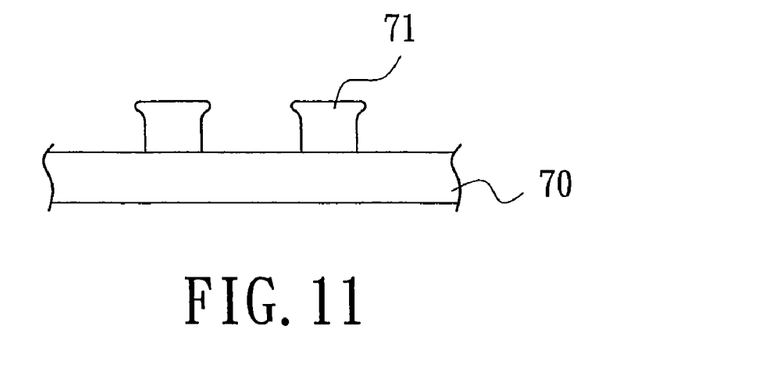
FIGS. 11 to 17 are schematic views to illustrate the consecutive steps of the first preferred embodiment of the method of this invention.
Figure 12:
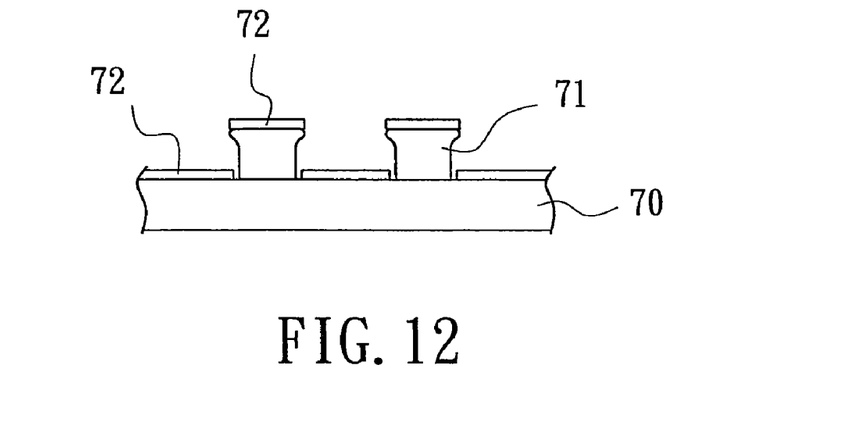
Figure 13:
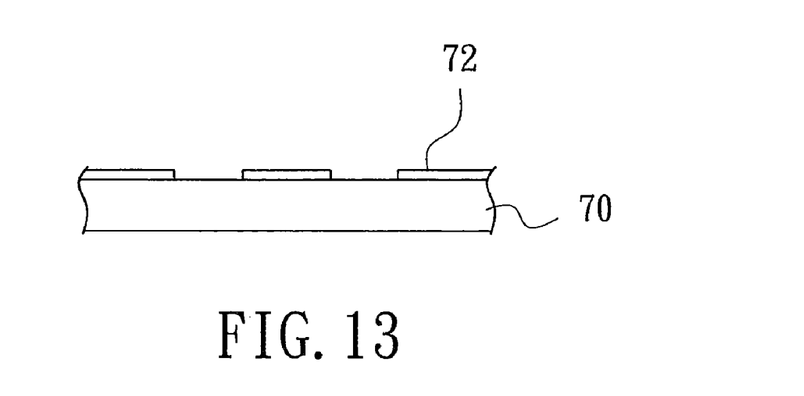
Figure 14:
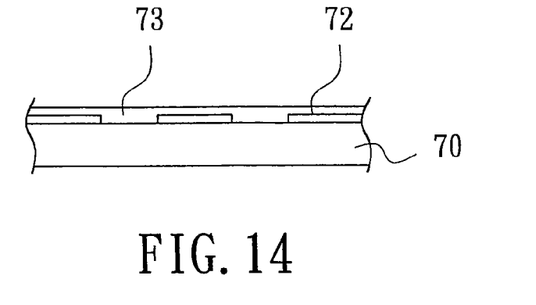
Figure 15:
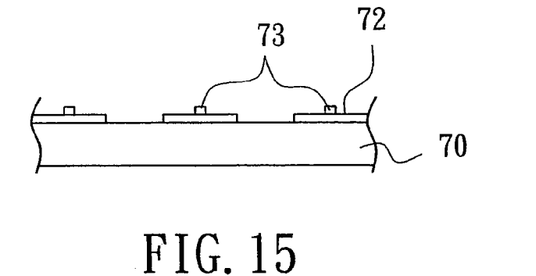
Figure 16:
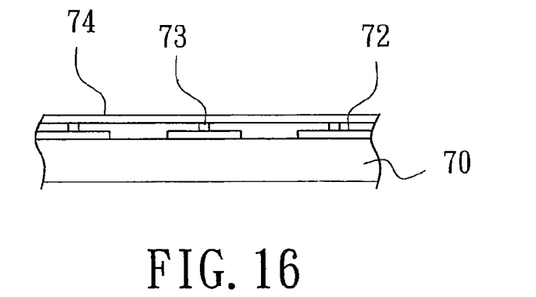
Figure 17:
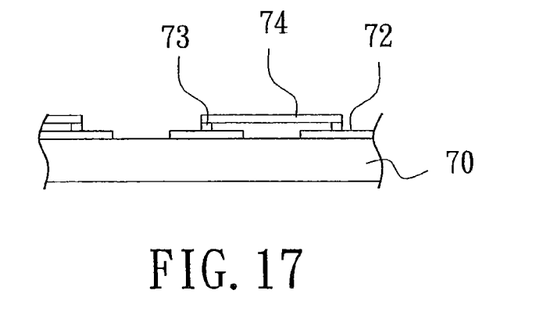

FIG. 10 illustrates the consecutive steps of the first preferred embodiment of a method which involves using lift-off techniques for forming the SAW die 3 according to this invention.

Referring to FIGS. 11 to 17, the method of the first embodiment includes the steps of: cleaning a wafer 70 having a wafer surface, the wafer surface defining the transducer-mounting surface 311 of the substrate 31 of the SAW die 3; forming a pattern of lift-off layer 71 on the wafer surface of the wafer 70 (see FIG. 11) through lithography techniques; forming a metal layer 72 on the wafer surface of the wafer 70 and the lift-off layer 71 through metallization techniques (see FIG. 12); removing the lift-off layer 71 and the metal layer 72 on the lift-off layer 71 by dissolving the lift-off layer 71 in a solution so as to form a pattern of the metal layer 72 (see FIG. 13), which forms the transmitting and receiving transducers 32, 32' of the SAW die 3, on the wafer surface of the wafer 70; forming a first photo sensitive layer 73 on the wafer surface of the wafer 70 and the metal layer 72 (see FIG. 14); forming a pattern of the first photo sensitive layer 73, which forms the peripheral wall 341 of the cap 34 of the SAW die 3, on the metal layer 72 after etching of the metal layer 72 (see FIG. 15) through lithography techniques; forming a pattern of a second photo sensitive layer 74 (see FIG. 16), which forms the cover wall 342 of the cap 34 of the SAW die 3, on the first photo sensitive layer 73 through lithography techniques (see FIG. 17); curing the first and second photo sensitive layers 73, 74; dicing the wafer 70 into SAW dies 3. The SAW dies 3 thus formed are subsequently subjected to encapsulation using the molding compound 44. Note that each of the first and second photo sensitive layers 73, 74 is in the form of a dry film prior to be formed on the wafer 70. The dry film is subsequently processed to form a desired pattern using lithography techniques.

Figure 18:
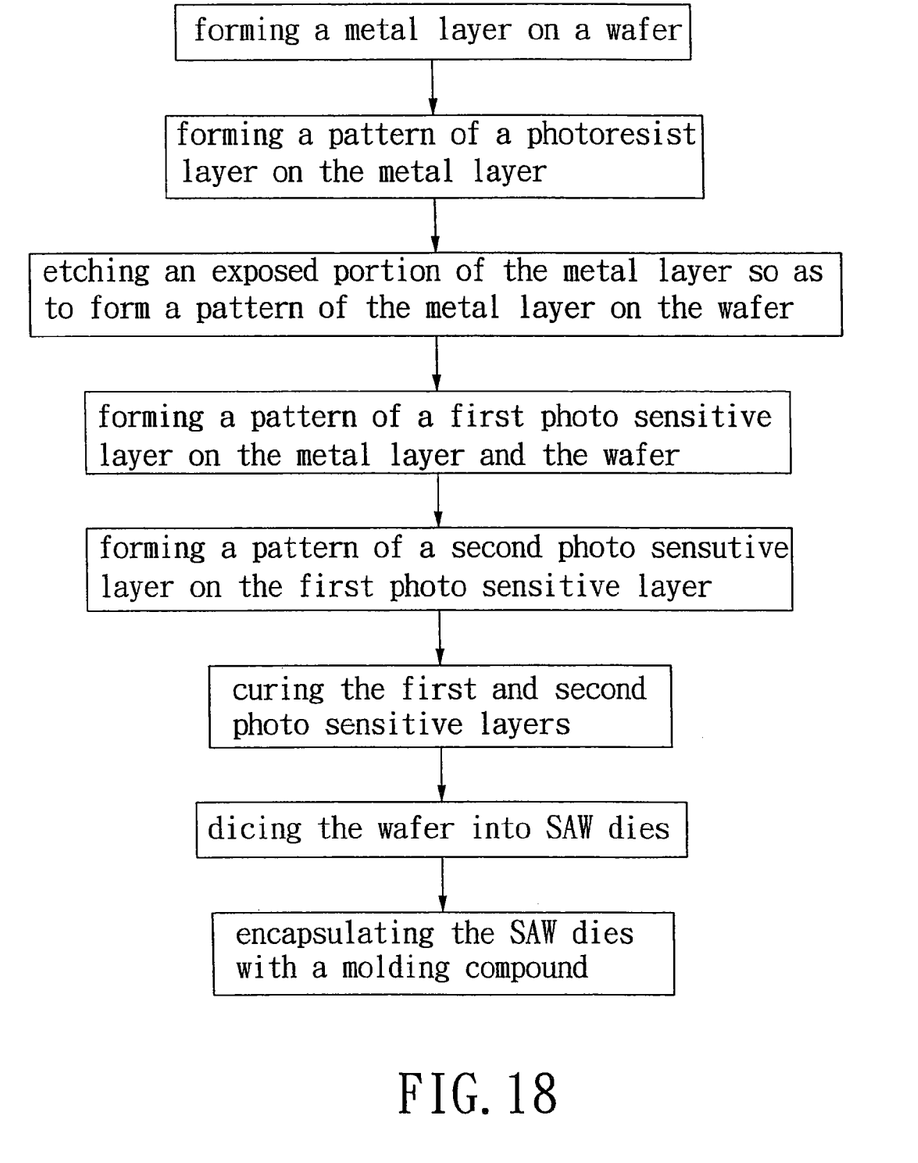
FIG. 18 is a flow diagram illustrating consecutive steps of the second preferred embodiment of the method for forming the SAW die according to this invention.
Figure 19:
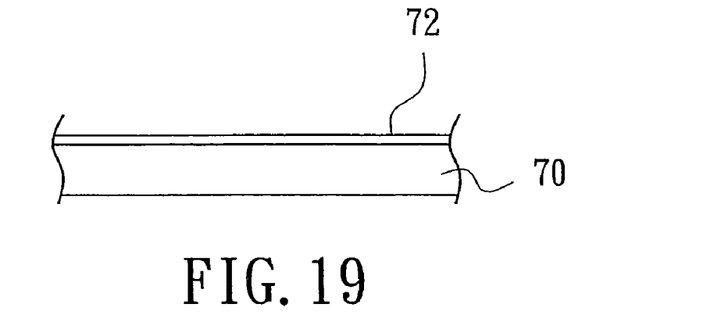
FIGS. 19 to 21 are schematic views to illustrate the consecutive steps of the second preferred embodiment of the method of this invention.
Figure 20:
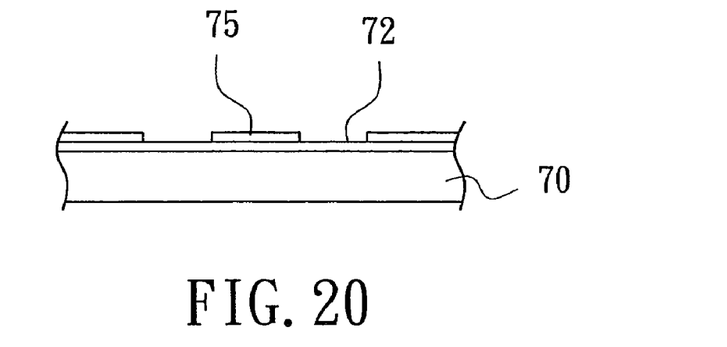
Figure 21:
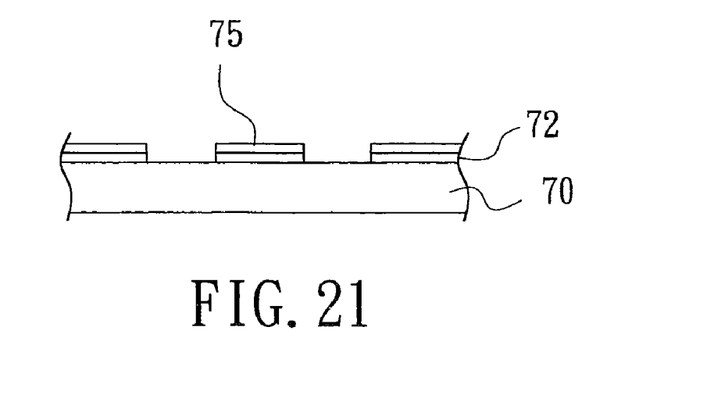

FIG. 18 illustrates the consecutive steps of the second preferred embodiment of the method for forming the SAW die 3 according to this invention. The method of this embodiment differs from the previous embodiment in that the pattern of the metal layer 72 is formed by metal etching techniques instead of the lift-off techniques. In this embodiment, the pattern of the metal layer 72 is formed by forming the metal layer 72 on the wafer surface of the wafer 70 (see FIG. 19) through metallization techniques after the wafer 70 is cleaned, forming a pattern of a photoresist layer 75 on the metal layer 72 through lithography techniques (see FIG. 20), and wet etching an exposed portion of the metal layer 72 that is exposed from the photoresist layer 75 so as to form the pattern of the metal layer 72 on the wafer surface of the wafer 70 (see FIG. 21). The photoresist layer 75 is subsequently removed from the metal layer 72 so as to form into a structure similar to that of FIG. 13 for subsequent processing steps of forming the cap 34 on the metal layer 72 which are similar to those of the first preferred embodiment.

With the inclusion of the cap 34, which is formed on the substrate 31 by semiconductor processing techniques, in the SAW die 3 of the SAW device package 4 of this invention, the SAW die 3 can be directly molded with the molding compound 44, thereby eliminating the aforesaid drawbacks associated with the prior art. Moreover, the SAW device package 4 thus formed can be encapsulated with other electronic components to form a hybrid package for the purposes of product miniaturization and reducing manufacturing costs.

While the present invention has been described in connection with what is considered the most practical and preferred embodiments, it is understood that this invention is not limited to the disclosed embodiments but is intended to cover various arrangements included within the spirit and scope of the broadest interpretations and equivalent arrangements.

I claim:

1. A method for making a surface acoustic wave (SAW) device package that includes a SAW die having a piezoelectric substrate, and transmitting and receiving transducers and a cap formed on the substrate, the cap having a peripheral wall and a cover wall which cooperate with the substrate to define an embedded air cavity thereamong, said method comprising the steps of:
    forming a pattern of lift-off layer on a wafer surface of a wafer through lithography techniques;
    forming a metal layer on the wafer surface of the wafer and the lift-off layer through metallization techniques;
    removing the lift-off layer and the metal layer on the lift-off layer by dissolving the lift-off layer in a solution so as to form a pattern of the metal layer, that defines the transmitting and receiving transducers of the SAW die, on the wafer surface of the wafer;
    forming a pattern of a first photo sensitive layer, which defines the peripheral wall of the cap of the SAW die, on the metal layer and the wafer surface of the wafer through lithography techniques;
    forming a pattern of a second photo sensitive layer, which defines the cover wall of the cap of the SAW die, on the first photo sensitive layer through lithography techniques;
    curing the first and second photo sensitive layers;
    dicing the wafer into SAW dies; and
    encapsulating the SAW dies with a molding compound.

2. The method of claim 1, wherein each of the first and second photo sensitive materials is selected from the group consisting of photoresists, epoxy resin, polyimide, benzocyclobutene, acrylic-based materials, and mixtures thereof.

3. A method for making a SAW device package that includes a SAW die having a piezoelectric substrate, and transmitting and receiving transducers and a cap formed on the substrate, the cap having a peripheral wall and a cover wall which cooperate with the substrate to define an embedded air cavity thereamong, said method comprising the steps of:
    forming a metal layer on a wafer surface of a wafer through metallization techniques;
    forming a pattern of a photoresist layer on the metal layer through lithography techniques;
    etching an exposed portion of the metal layer that is exposed from the photoresist layer so as to form a pattern of the metal layer, which defines the transmitting and receiving transducers of the SAW die, on the wafer surface of the wafer;
    forming a pattern of a first photo sensitive layer, which defines the peripheral wall of the cap of the SAW die, on the metal layer and the wafer surface of the wafer through lithography techniques;
    forming a pattern of a second photo sensitive layer, which defines the cover wall of the cap of the SAW die, on the first photo sensitive layer through lithography techniques;
    curing the first and second photo sensitive layers;
    dicing the wafer into SAW dies; and
    encapsulating the SAW dies with a molding compound.

4. The method of claim 3, wherein each of the first and second photo sensitive materials is selected from the group consisting of photoresists, epoxy resin, polyimide, benzocyclobutene, acrylic-based materials, and mixtures thereof.

* * * * *